United States Patent [19]
Myers et al.

[11] Patent Number: 5,224,126
[45] Date of Patent: Jun. 29, 1993

[54] PHASE AMBIGUITY RESOLUTION FOR MANCHESTER-ENCODED DATA

[75] Inventors: John H. Myers, Jersey City; Lewis F. Von Thaer, Boonton; Phillip A. Wissell, Jersey City, all of N.J.

[73] Assignee: AT&T Bell Laboratories, Murray Hill, N.J.

[21] Appl. No.: 738,695

[22] Filed: Jul. 31, 1991

[51] Int. Cl.$^5$ ............................................. H04L 27/22
[52] U.S. Cl. ...................................... 375/87; 375/110; 341/70; 328/127; 328/201; 328/207
[58] Field of Search ................. 375/110, 87; 341/70; 360/40; 328/127, 201, 207, 63; 364/828; 307/273, 269

[56] References Cited
U.S. PATENT DOCUMENTS 3,491,202  1/1970  Bailey et al. .................... 375/87 X
4,733,404  3/1988  Ostoich ............................ 375/110 X Primary Examiner—Curtis Kuntz
Assistant Examiner—Tesfaldet Bocure
Attorney, Agent, or Firm—Charles E. Graves

[57] ABSTRACT

Regeneration of a Manchester coded data stream is improved by a system for distinguishing which data signal transitions are bit center and which are bit end transitions. Using a monostable flip-flop with associated phasing and timing circuits including a feedback circuit from the clock output itself, the edge transitions are masked to allow only the center transitions to be passed and then used to create the timing pulses. A system for avoiding lockup of the apparatus on an erroneous initial pulse is also described.

7 Claims, 3 Drawing Sheets

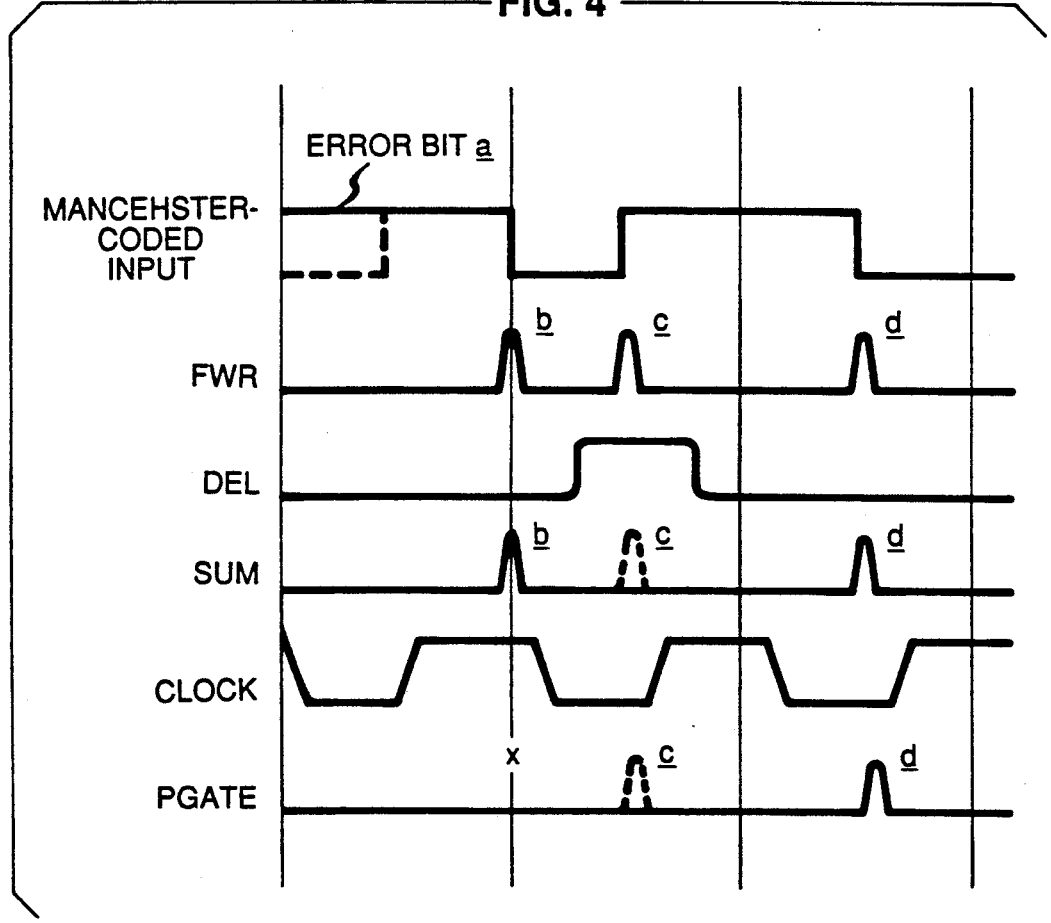

PHASE AMBIGUITY RESOLUTION FOR MANCHESTER-ENCODED DATA

GOVERNMENT CONTRACT

The government has rights in this invention pursuant to Contract No. N00039-89-C-0089 awarded by the Department of the Navy.

FIELD OF THE INVENTION

This invention relates to binary coding processes and specifically to a method for recovering a data stream of "Manchester" coded data despite possible decision clock "phase ambiguity".

BACKGROUND OF THE INVENTION

The well-known Manchester coding technique uses a bi-phase code, in which each transmitted bit is encoded as two bits, represented by an "on" state and an "off" state. Because of its high energy content at the clock recovery frequency, Manchester coding is advantageous in many applications such as those where data scramblers are not feasible or in connection with very long transmission systems with large numbers of repeaters.

To regenerate Manchester code in a timing recovery circuit requires the determination of which of the Manchester data signal transitions are the "bit-center" and which transitions present are "bit-edge" transitions. This uncertainty is called "phase-ambiguity," since normal NRZ Clock Recovery techniques will not resolve the proper phase.

Prior art schemes for making this determination exhibit some disadvantages. Among these is that a check for proper phase must be generated at twice the data frequency. Further, in the prior art schemes, output clock jitter will be pattern-dependent and will disadvantageously add to the signal being processed as a correlated source. Additionally, later error detection and fault location in the converted data stream are made more difficult.

OBJECT OF THE INVENTION

Accordingly, one object of the invention is to make a reliable determination of the bit centers in a stream of Manchester coded data.

Another object of the invention is to eliminate pattern dependencies in the recovered clock output.

SUMMARY OF THE INVENTION

In accordance with the invention, a novel detector circuit is provided which receives a differentiated and full-wave-rectified version of a Manchester coded data input signal, and, using a monostable flip-flop to trigger a masking signal and some associated circuit functions, selects the correct phase of the data input signal regardless of the nature of the patterns of ones and zeros in the input signal. The masking signal seeks and finds a valid center transition, and then stays "on" long enough to cancel or mask any following edge transition. The result is an output signal from which the clock pulses can be reconstituted, which output signal contains only full-wave-rectified signal pulses corresponding in time to the center of the incoming data bit. Any pulses that correspond to the input data bit edges (as opposed to the bit centers) are blocked and subsequently ignored. The resulting output clock pulse contains only the desired pulses, which unambiguously correspond only to the centers of the incoming Manchester coded data signals.

DESCRIPTION OF THE DRAWINGS

FIG. 4 is a further waveform diagram illustrating the function of a phasing gate.

DETAILED DESCRIPTION OF AN ILLUSTRATIVE EMBODIMENT

Figure 1:
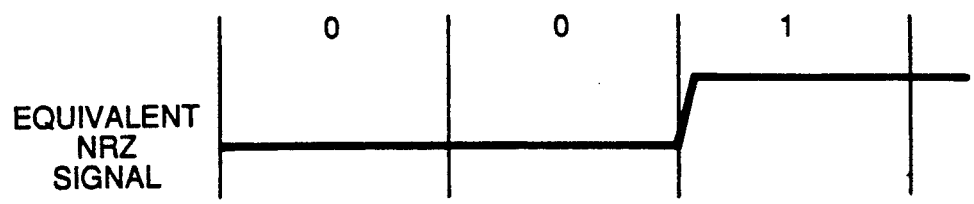
FIG. 1 is a diagram illustrating a typical NRZ-coded signal.

The familiar NRZ code format is depicted in FIG. 1. The high signal level signifies the value "1," and the low level signifies the value "0." A change in signal level from one time slot to the next generates a transition edge. No change in signal value, indicating two successive bits of the same value, does not cause a transition edge.

Manchester code differs in format from NRZ code, one consequence of the format difference being the phase ambiguity problem. The present invention, which eliminates phase ambiguity, will first be described by reference to FIG. 2 in terms of waveform generations, followed by an illustration of circuitry for creating the waveforms.

Figure 2:
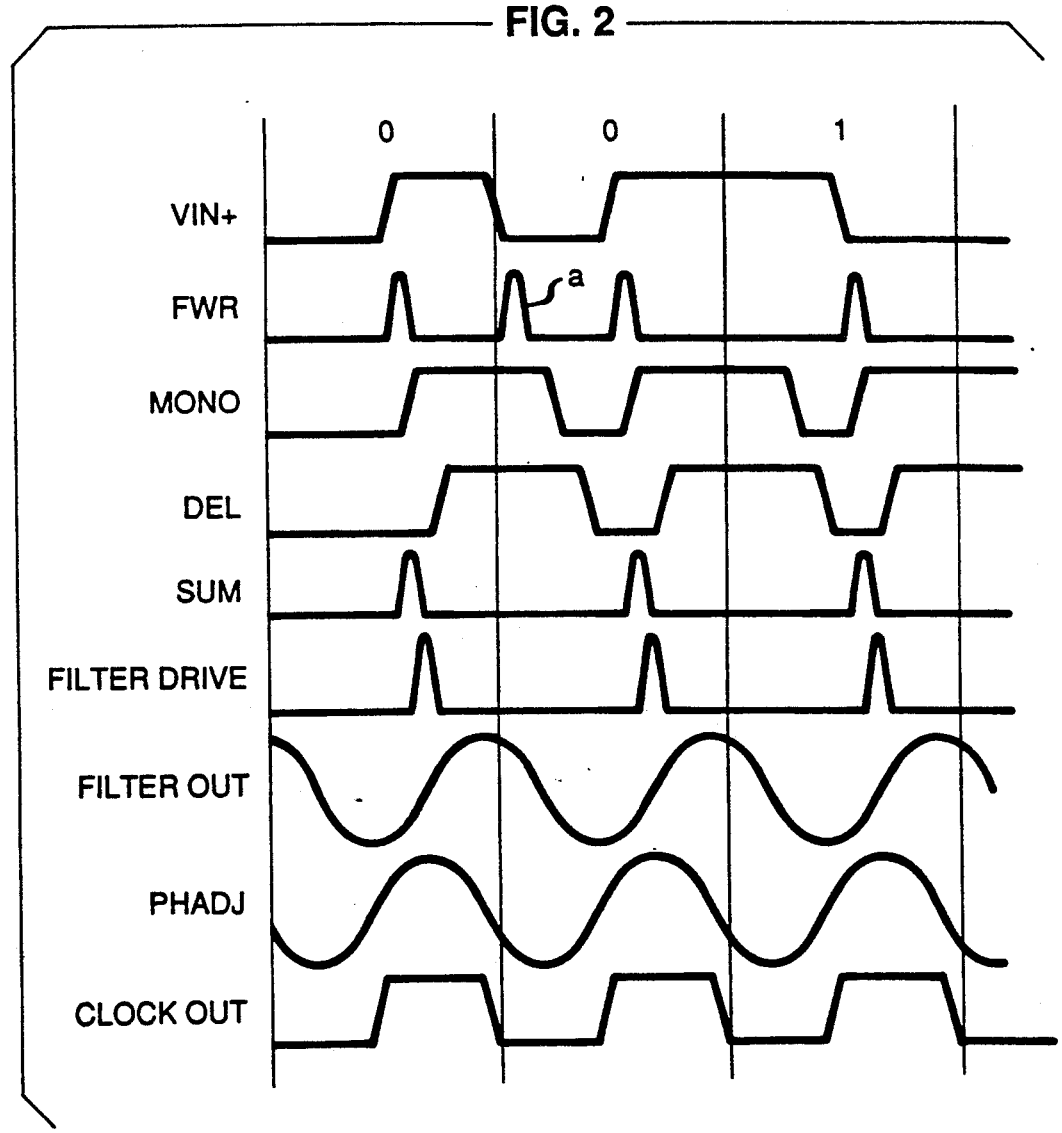
FIG. 2 is a set of signal patterns illustrating the step-by-step blocking or masking of out-of-phase components of the data input signal.

The Manchester code format is depicted as the trace at the top of FIG. 2. In the Manchester input signal $V_{IN}$, the 1 and 0 binary information is contained as center transitions, several such transitions being shown. The input signal is first differentiated and then full-wave rectified. Each transition appears as a pulse on the FWR plot of FIG. 2. Certain of the transitions, such as the one depicted as transition "a," are not desired because they are end, and not center, transitions. End transitions can create phase ambiguity.

In accordance with the invention, the FWR signal is fed as a trigger signal to a monostable flip-flop. The monostable flip-flop is adapted to stay "on" for an appreciable fraction of the timing cycle value, for example two-thirds of the time, and to thereafter return to its "off" state. If during the "on" time a FWR pulse associated with an edge transition occurs, the monostable flip-flop will not react to it, for reasons further explained below in connection with FIG. 3. This masking or blocking of an edge transition may be seen by considering the MONO plot of FIG. 2.

Prior to blocking the out-of-phase edge transition pulses, the monostable flip-flop output is delayed by a small fraction such as one-sixth of the timing cycle. The delayed signal is shown as the DEL plot of FIG. 2. This allows the negative component (not shown) of the monostable output to be "ANDED" in a summer with the full-wave rectified input signal, for the purpose of blocking out the pulse associated with edge transition. The resulting signal contains only the center transition spikes, with the edge transition spikes removed, as seen in the trace of FIG. 2 denoted "SUM." The SUM signal then is inputted to a filter driver where it is quantized; and the output from there is inputted to a narrow band filter which performs the operation of removing the wideband noise from the signal.

The filter output is a sine wave as seen in the FILTER OUT plot of FIG. 2. This sine wave signal then is phase-adjusted to align the output clock pulse with the center of the data signal or "eye" for sampling at the point where the data has its maximum signal-to-noise ratio. The plot is denoted PHADJ in FIG. 2. This output is then converted into a square wave or near-square wave which is the output clock signal. Advantageously, the signal seen at the crystal filter 17 is independent of the pattern of the input data as a result of the invention. Therefore, the opportunity for an error or jitter signal arising from the pattern of the input data is substantially eliminated.

Figure 3:
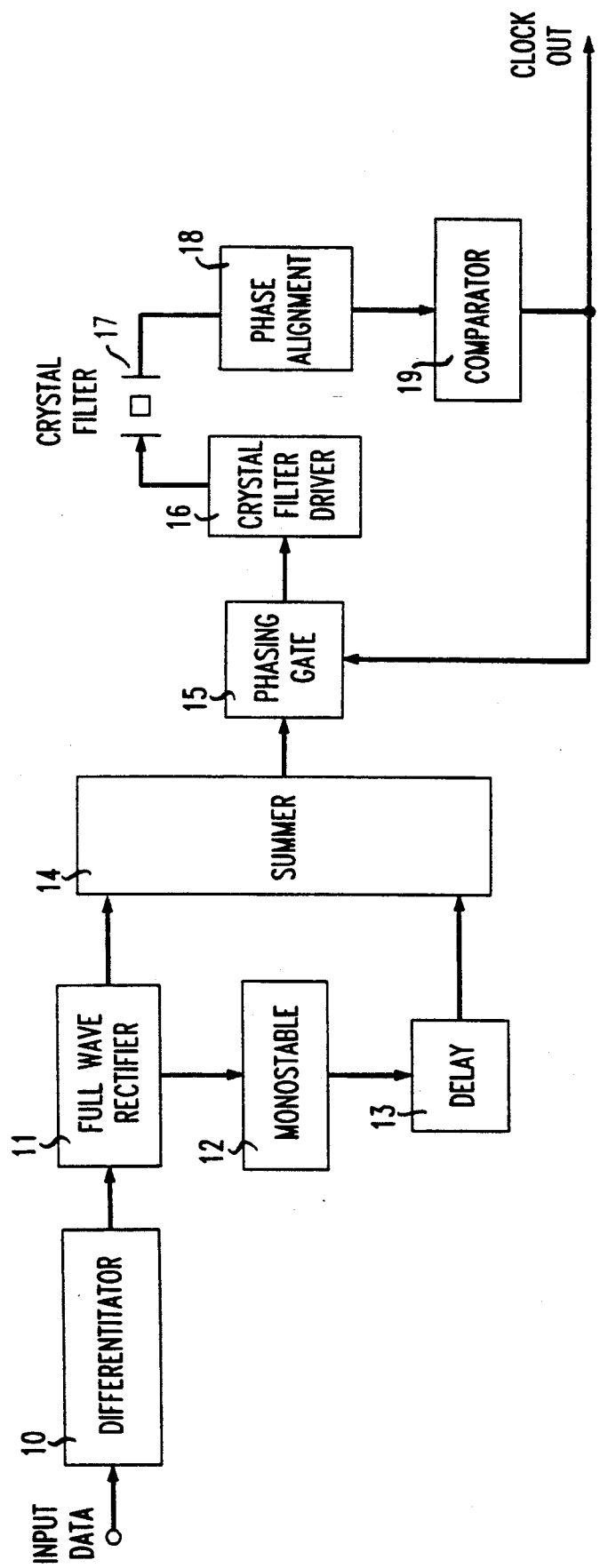
FIG. 3 is a block diagram of an exemplary circuit which practices the invention.

FIG. 3 shows a high-level block diagram of one circuit which implements the present invention, using certain generic timing extraction blocks for the clock recovery apparatus. Input data from, for example, a transmitter or a previous repeater, is entered to a conventional differentiator circuit 10. From circuit 10 the signal is fed to a full-wave rectifier 11. The output is a data signal which is quantized, differentiated and rectified. Two outputs from the rectifier 11 are provided: one is inputted to monostable flip-flop 12 and the second is fed directly to a summer 14. Monostable flip-flop circuit 12 selects the desired phase information from the data signal, by providing a signal that blocks detection of the edge transition. Thus, the output of summer 14 is assured of having only the full-wave rectified signal pulses associated with the center of the incoming data bits.

In accordance with another aspect of the invention, monostable flip-flop 12 selects the correct phase of the incoming data signal upon receiving the first 0-1 or 1-0 transition of the data stream. Generally, if a center transition is missing because of an error in the input data, the monostable will trigger on an incorrect phase. These incorrect pulses are prevented from reaching a filter drive circuit by a phasing gate 15, in the following way. The clock output is "ANDED" with the summer output in phasing gate 15 as seen in FIG. 4. The output is high only when the SUM plot is high and the clock plot is low. It is seen that the Pgate signal does not respond to the edge transitions since the clock plot is high at that time.

To describe this aspect of the invention more specifically, bit errors are sometimes caused by reduced signal quality at many possible points in a data transmission system. In the event of a single bit error, the monostable flip-flop 12 will lock onto the wrong phase of the input data, and stay locked until the next 1-0 or 0-1 transition of the incoming data stream is received. In such a case, filter 17 would be driven by edge transition spikes, a result to be avoided. To prevent this result, phasing gate 15 is included in the illustrative circuit of FIG. 3, to prevent any edge pulses from reaching the filter 17.

FIG. 4 shows the waveform sequence operating with phasing gate 15, consisting of an INPUT plot containing a bit, designated "a," which is erroneous. The term in this context means that information to determine whether the bit is a 1 or a 0 is not present. As earlier described, the INPUT data first is full-wave rectified to create transition point spikes. If one of these spikes, for example pulse b, corresponds to the erroneous bit, the monostable flip-flop will act upon it, resulting as illustrated in FIG. 4 in the first good signal, c, being masked and in the edge pulse b triggering the filter driver. It would be advantageous when monostable circuit 12 locks on to the error signal that the edge pulse b is prevented from reaching the filter driver 16. Phasing gate 15 accomplishes the foregoing by cancelling signal b. Then, although the first valid signal c is masked, at the next valid 0-1 or 1-0 transition spike, d, the monostable circuit is realigned to the correct phase.

The output of phasing gate 15 is next inputted into the driver circuit 16 of filter 17. In driver 16, the signal is quantized before transmission to filter 17. Filter 17 may be a crystal or SAW (surface acoustic wave) filter, to provide the advantages of very narrow bandwidths and high noise rejection. The sine wave output from filter 17 is fed to phase alignment circuit 18, which may be a quandrature mixer. Here in the phase alignment circuit the output phase coming from filter 17 is adjusted by whatever amount is necessary to align the output clock signal coming from the clock-out point so that the clock signal occurrence coincides with the center of the input data signal as seen in FIG. 2, trace $V_{IN}$. Finally, the phase-adjusted output from phase alignment circuit 18 is sent to comparator 19 where it is transformed into a near square wave.

In sum, the invention achieves an output that is not dependent on the input data. The invention also achieves a clock-out signal that oscillates at the data frequency instead of at twice the data frequency. This result occasions less demand for expensive high-speed circuits by reducing the bandwidth requirements of the circuit.

We claim:

1. In the regeneration of a Manchester coded data stream, apparatus for generating clocking signals corresponding in timing only to the centerpoints of each data bit, comprising:

means for receiving an incoming Manchester data stream said received data stream having both edge transition and center transition components;

first circuit means for differentiating and full-wave rectifying said received data stream to produce a pulse output with each pulse corresponding to a said transition in said received data stream;

a monostable flip-flop circuit connected to said first circuit means and responsive to each pulse output therefrom for turning to its "on" state for a prescribed portion of the apparatus timing cycle and thereafter turning to its "off" state until receipt of the next said pulse output;

second circuit means connected to said flip-flop circuit for delaying said flip-flop output;

a summing circuit connected to the outputs of said first and said second circuit means for additively combining their respective outputs;

said summing circuit including means for masking a said first circuit means output in the presence of a said second circuit output; and means for generating a clock output triggered by the output from said summing circuit.

2. Apparatus in accordance with claim 1, wherein said monostable flip-flop circuit further comprises means for remaining in its "on" state for substantially two-thirds of the apparatus timing cycle time.

3. Apparatus is accordance with claim 2, wherein said second circuit means further comprises means for effecting a delay in the output of said monostable flip-flop circuit of substantially one-sixth of the apparatus timing cycle time.

4. Apparatus in accordance with claim 3, wherein the output level of said flip-flop circuit during its "on" state is substantially the same amplitude as each said pulse output.

5. Apparatus in accordance with claim 4, wherein said means for generating said clock output comprises:
a phasing gate connected to said summing circuit for receiving said summing circuit output and a signal from a feedback loop;
a narrow-band filter including a driver circuit connected to the output of said phasing gate, said filter generating a sine wave output;
a phase alignment circuit connected to said filter and comprising means for adjusting the output phase of said filter output sine wave;
a comparator receiving the output of said phase alignment circuit for transforming the output of said phase alignment circuit to a square wave, said square save constituting said clock output; and
said phasing gate feedback loop containing said clock output.

6. In the regeneration of a Manchester coded data stream, a method for generating clocking signals corresponding in timing only to the centerpoints of each data bit, comprising:
receiving an incoming Manchester data stream said received data stream having both edge transition and center transition components;
differentiating and full-wave rectifying said received data stream to produce a pulse output with each pulse corresponding to a said transition in said received data stream;
triggering a monostable flip-flop circuit in response to said rectified pulses to turn to its "on" state for a substantial portion of the data stream timing cycle and thereafter turn to its "off" state until receipt of the next said rectified pulse output;
adding the "on" state signal of said flip-flop to said rectified pulses, thereby to block any said rectified pulses received during said "on" time; and
generating a clock output from the preceding step.

7. The method of claim 6, wherein in said triggering step, said monostable flip-flop circuit remains in its "on" state for substantially two-thirds of the timing cycle.

* * * * *